(12) United States Patent
Kamata

(10) Patent No.: US 10,283,707 B2
(45) Date of Patent: May 7, 2019

(54) SUPERLATTICE MEMORY HAVING GETE LAYER AND NITROGEN-DOPED $SB_2TE_3$ LAYER AND MEMORY DEVICE HAVING THE SAME

(71) Applicant: KABUSHIKI KAISHA TOSHIBA, Minato-ku (JP)

(72) Inventor: Yoshiki Kamata, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 47 days.

(21) Appl. No.: 15/457,479

(22) Filed: Mar. 13, 2017

(65) Prior Publication Data

US 2018/0114900 A1 Apr. 26, 2018

(30) Foreign Application Priority Data

Oct. 20, 2016 (JP) .................. 2016-205908

(51) Int. Cl.
*H01L 45/00* (2006.01)
*H01L 27/24* (2006.01)
*H01L 29/15* (2006.01)

(52) U.S. Cl.
CPC ........ *H01L 45/144* (2013.01); *H01L 27/2409* (2013.01); *H01L 27/2427* (2013.01);
(Continued)

(58) Field of Classification Search
CPC . H01L 45/08; H01L 27/2463; H01L 45/1233; H01L 27/2409; H01L 45/144; H01L 27/2427; H01L 29/151
See application file for complete search history.

(56) References Cited

U.S. PATENT DOCUMENTS

2008/0145702 A1 6/2008 Shin et al.
2008/0283817 A1 11/2008 Yu et al.
(Continued)

FOREIGN PATENT DOCUMENTS

JP 2008-153649 7/2008
JP 2008-288587 11/2008
(Continued)

OTHER PUBLICATIONS

Egami, T. et al., "Investigation of multi-level-cell and SET operations on super-lattice phase change memories," Japanese Journal of Applied Physics 53, 04ED02 (2014).*
(Continued)

*Primary Examiner* — Michael Jung
(74) *Attorney, Agent, or Firm* — Oblon, McClelland, Maier & Neustadt, L.L.P.

(57) ABSTRACT

According to one embodiment, a superlattice memory comprises substrate, a first electrode provided on the substrate, a second electrode arranged in opposition to the first electrode, and a superlattice structure part provided between the first electrode and the second electrode, which includes first chalcogen compound layers, second chalcogen compound layers of which is different from the first chalcogen compound, and contains Ge, and third chalcogen compound layers in which one of N, B, C, O, and F is added to the first chalcogen compound, stacked one on another.

16 Claims, 14 Drawing Sheets

(52) U.S. Cl.
CPC .......... *H01L 27/2463* (2013.01); *H01L 45/06* (2013.01); *H01L 45/065* (2013.01); *H01L 45/08* (2013.01); *H01L 45/1233* (2013.01); *H01L 29/151* (2013.01)

(56) References Cited

U.S. PATENT DOCUMENTS

| | | | |
|---|---|---|---|
| 2010/0181548 | A1 | 7/2010 | Tominaga et al. |
| 2013/0221310 | A1* | 8/2013 | Morikawa ............ H01L 45/144 257/2 |
| 2014/0151622 | A1* | 6/2014 | Oyanagi ............ H01L 45/1233 257/2 |
| 2014/0185359 | A1* | 7/2014 | Furuhashi .......... G11C 13/0002 365/148 |
| 2014/0376307 | A1* | 12/2014 | Shintani ............ G11C 13/0004 365/163 |
| 2016/0233421 | A1* | 8/2016 | Suzuki ................ H01L 45/144 |
| 2017/0244031 | A1* | 8/2017 | Jeong ................. H01L 27/2463 |

FOREIGN PATENT DOCUMENTS

| | | |
|---|---|---|
| JP | 2010-171196 | 8/2010 |
| JP | 2014-107528 | 6/2014 |

OTHER PUBLICATIONS

Kim, K. et al., "Observation of molecular nitrogen in N-doped Ge2Sb2Te5," Appl. Phys. Lett. 89, 243520 (2006).*

Kim, M. S. et al, "Crystallization characteristics of nitrogen-doped Sb2Te3 films for PRAM application," Ceramics International 34 (2008) 1043-1046.*

Makino K. et al., "Coherent phonon study of (GeTe)I(Sb2Te3)m interfacial phase change memory materials," Appl. Phys. Lett. 105, 151902 (2014).*

Takaura, N. et al., "55-uA GexTe1-x/Sb2Te3 superlattice topological-switching random access memory (TRAM) and study of atomic arrangement in Ge—Te and Sb—Te structures," 2014 IEEE International Electron Devices Meeting (2014), pp. 29.2.1-29.2.4.*

Tan, C. C., et al., "Compositionally matched nitrogen-doped Ge2Sg2Te5/Ge2Sb2Te5 superlattice-like strucdtures for phase change random access memory," App. Phys. Lett. 103, 133507 (2013).*

Wang, C. et al., "Phase transition behaviors and thermal conductivity measurements of nitrogen-doped Sb2Te3 thin films," Materials Letters 64 (2010) 2314-2316.*

Yunmo Koo et al. "Te-Based Amorphous Binary OTS Device with Excellent Selector Characteristics for X-point Memory Applications," 2016 Symposium on VLSI Technology Digest of Technical Papers, 2016, pp. 2.

K. Shiraishi et al., "Physics in Charge Injection Induced On-Off Switching Mechanism of Oxide-Based Resistive Random Access Memory (ReRAM) and Superlattice GeTe/$Sb_2Te_3$ Phase Change Memory (PCM)," Extended Abstracts of the 2013 International Conference on Solid State Devices and Materials, Fukuoka, 2013, pp. 2.

Micron Technology Inc., "Realizing the Future: 3D XPointTM," https://es.slideshare.net/Syntech/intel-micron-unveil-breakthrough-3d-xpoint-memory-tech-a-revolutionary-breakthrough-in-memory-technology, Sep. 2015, pp. 14.

Naoki Yokoyama, "First Project: Core Technology Development of Green and Nanoelectronics," The 5th TIA-nano Open Symposium, Sep. 2014, pp. 46 (with Machine Generated English Translation).

Susumu Soeya et al., "Crystalline structure of GeTe layer in GeTe/Sb2Te3 superlattice for phase change memory," Journal of Applied Physics, vol. 112, No. 3, Aug. 2012, pp. 5.

* cited by examiner

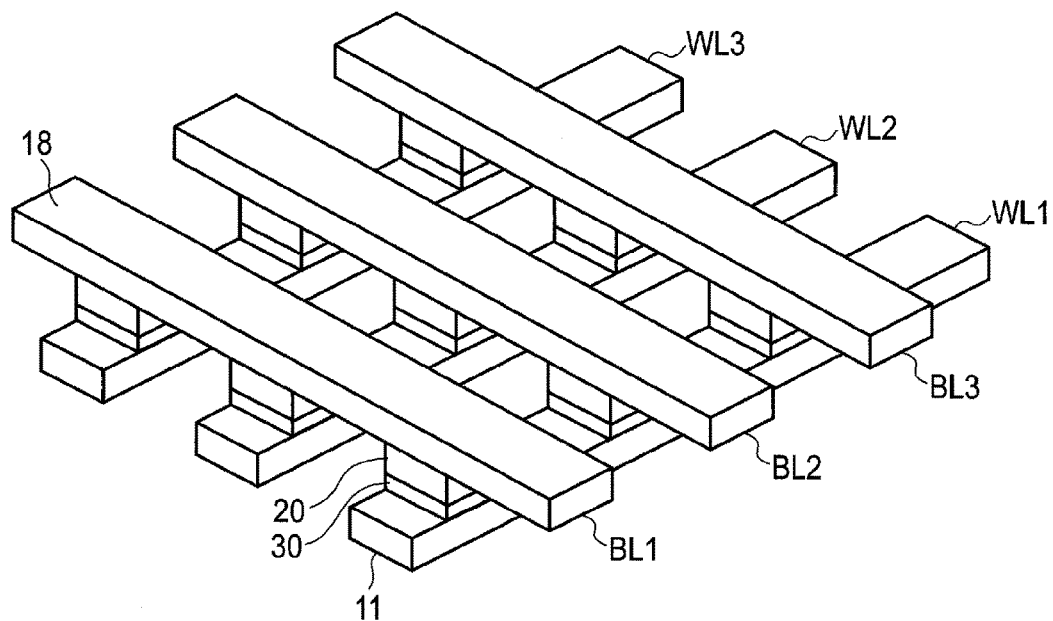
F I G. 1
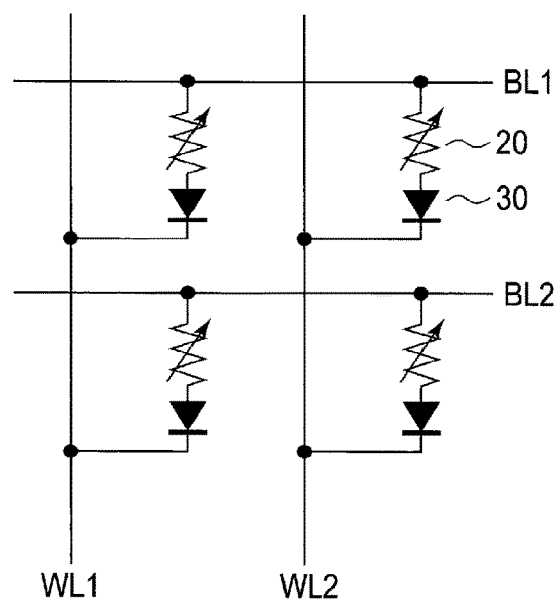
F I G. 2

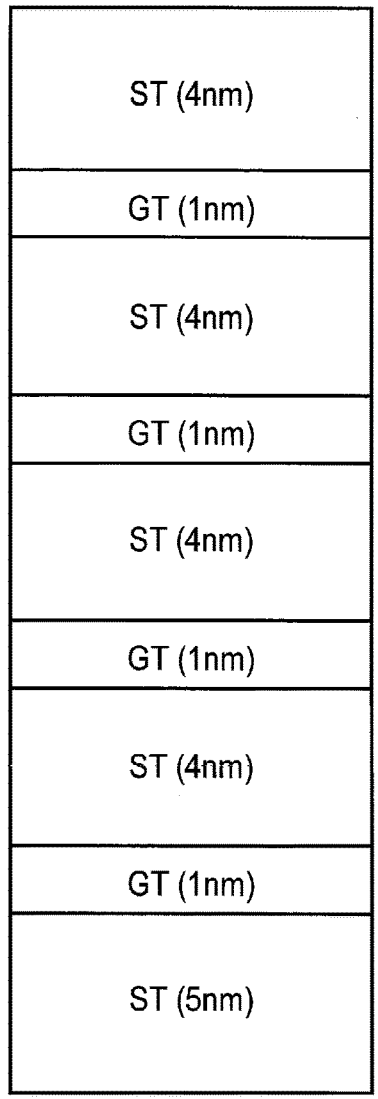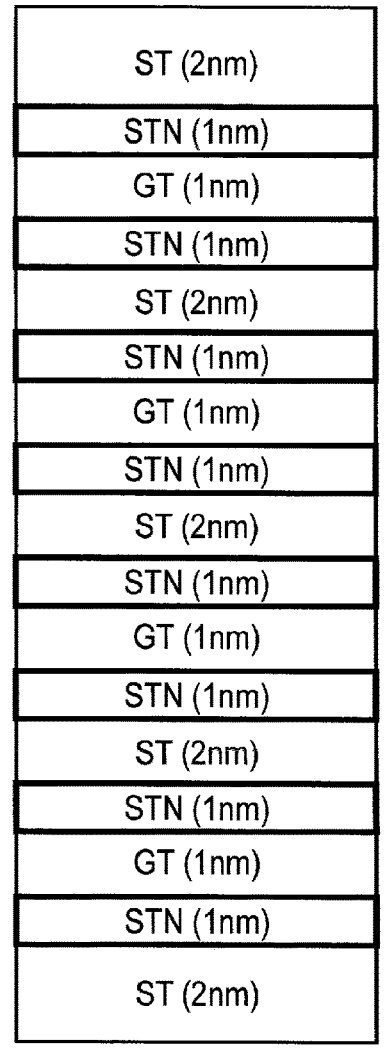
F I G. 4A    F I G. 4B

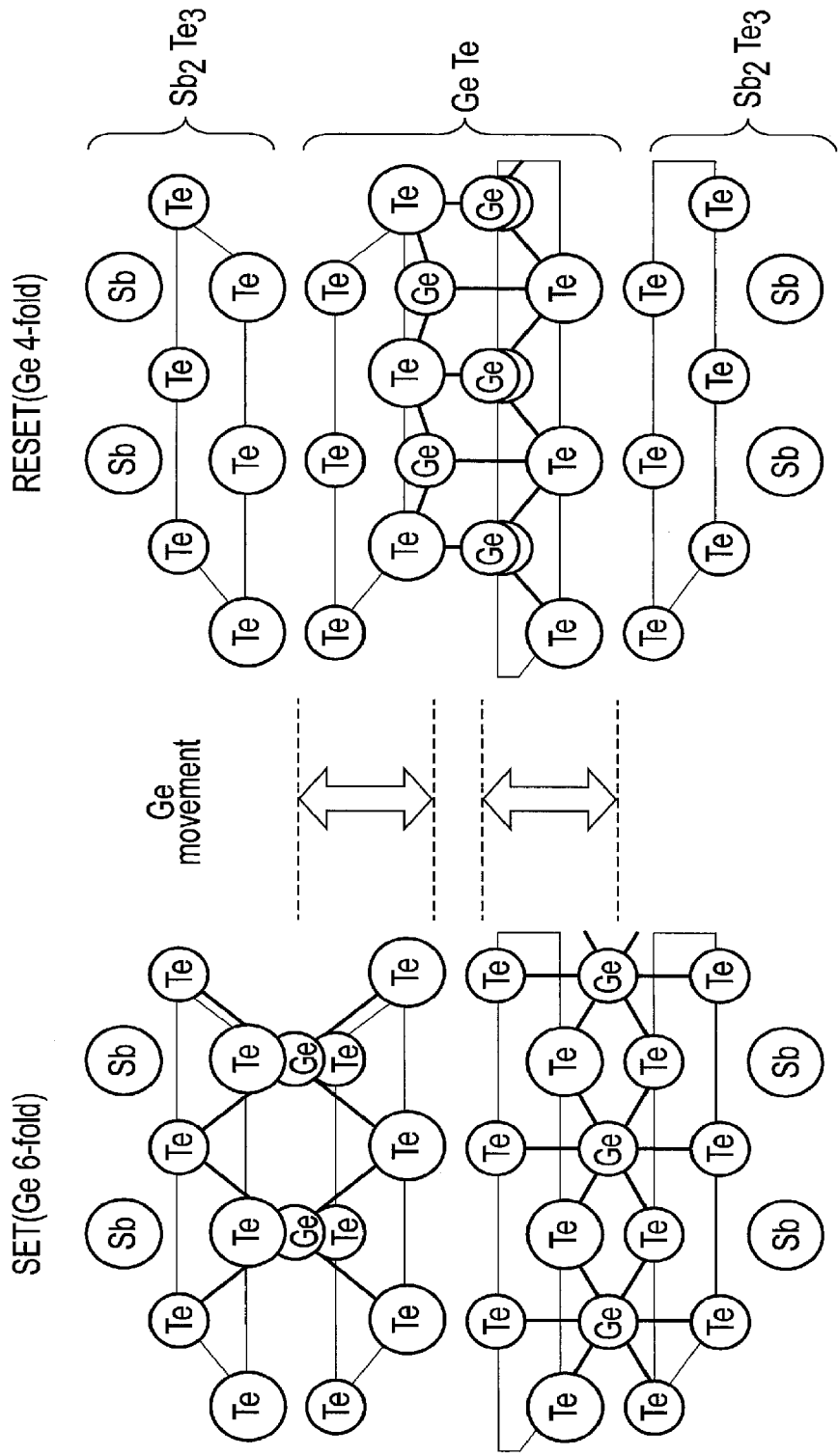
F I G. 5

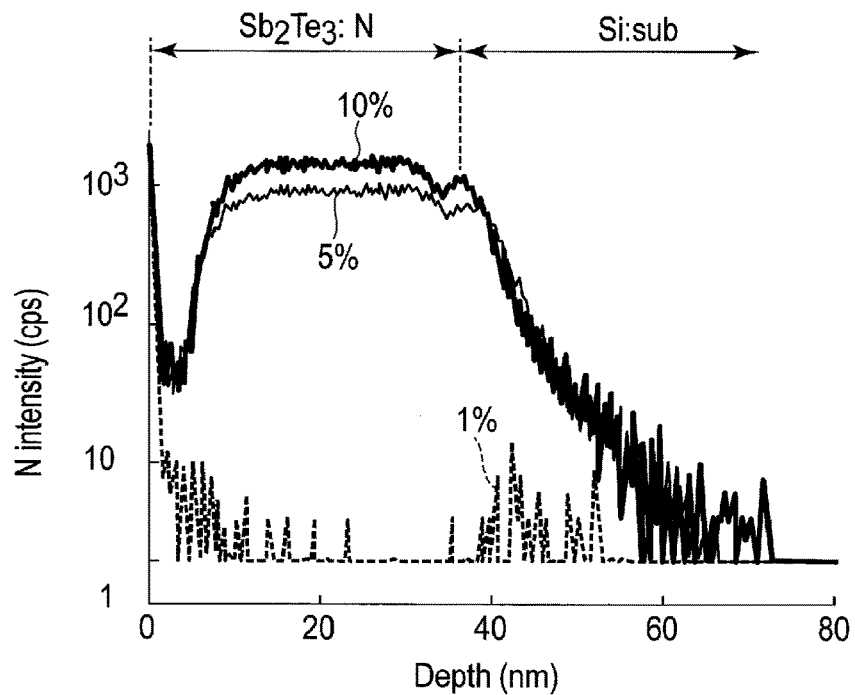
F I G. 6
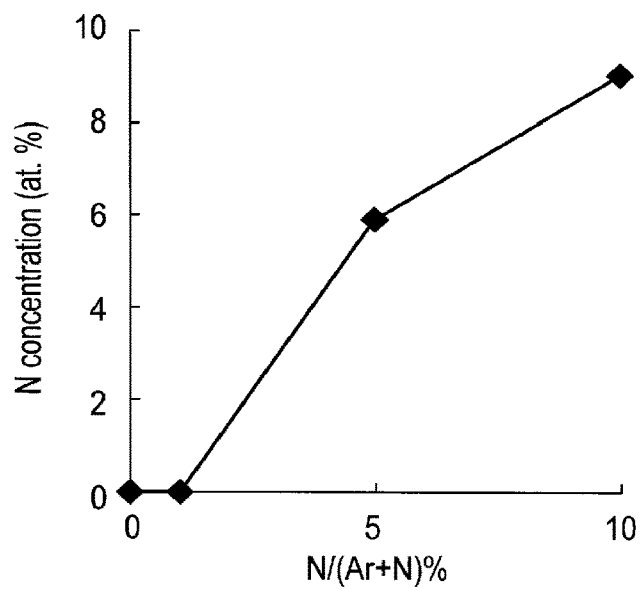
F I G. 7

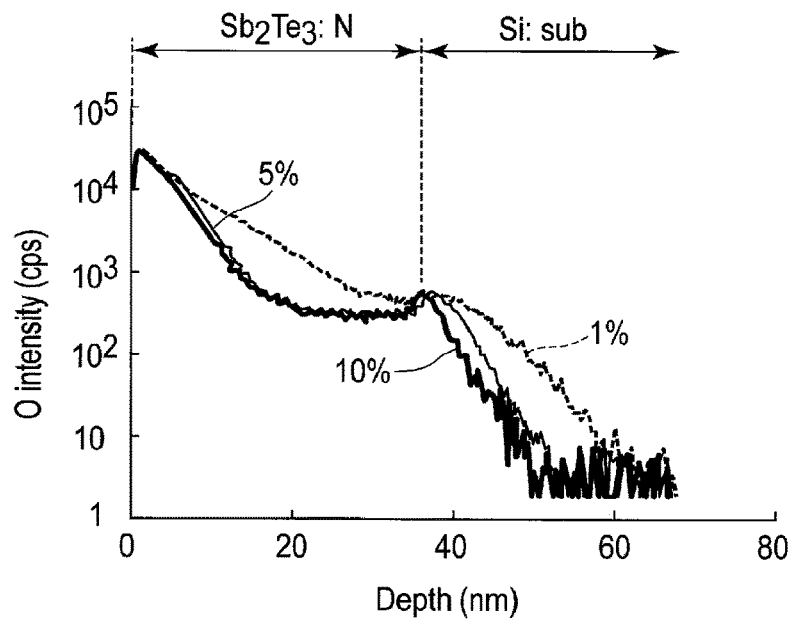
F I G. 8
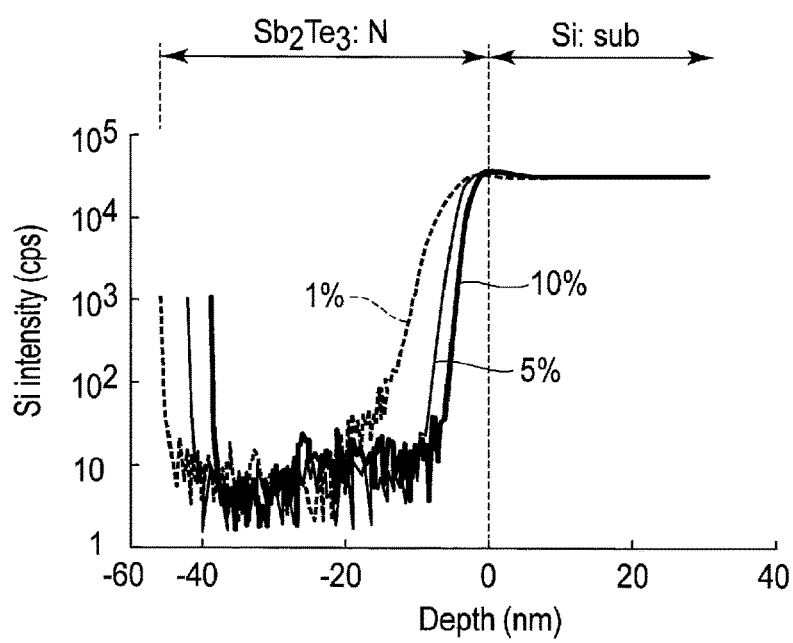
F I G. 9

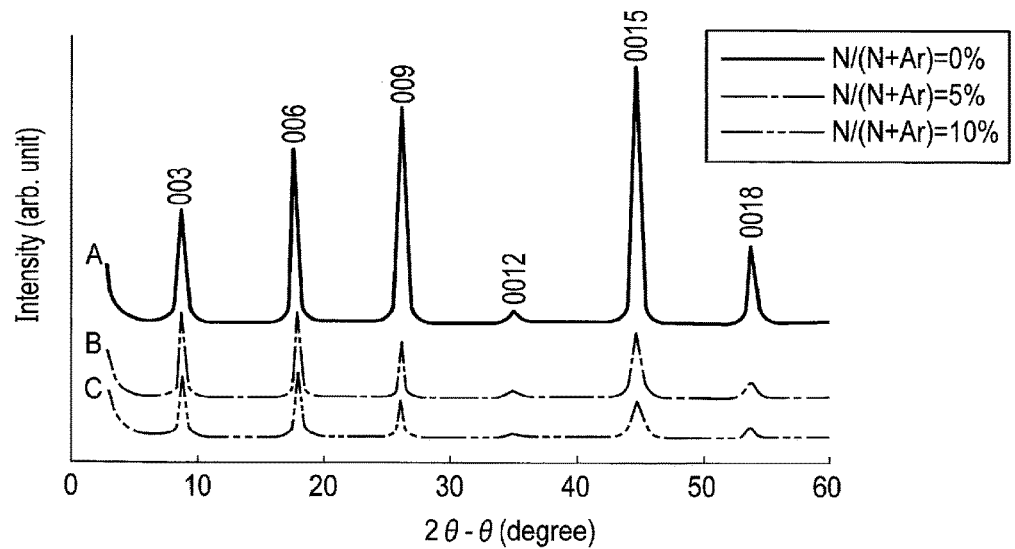
F I G. 10
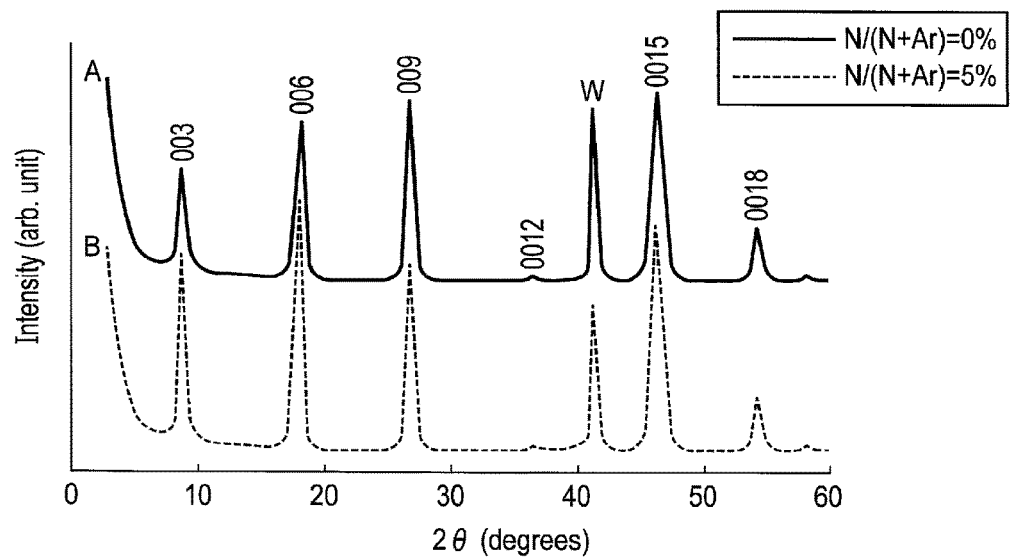
F I G. 11

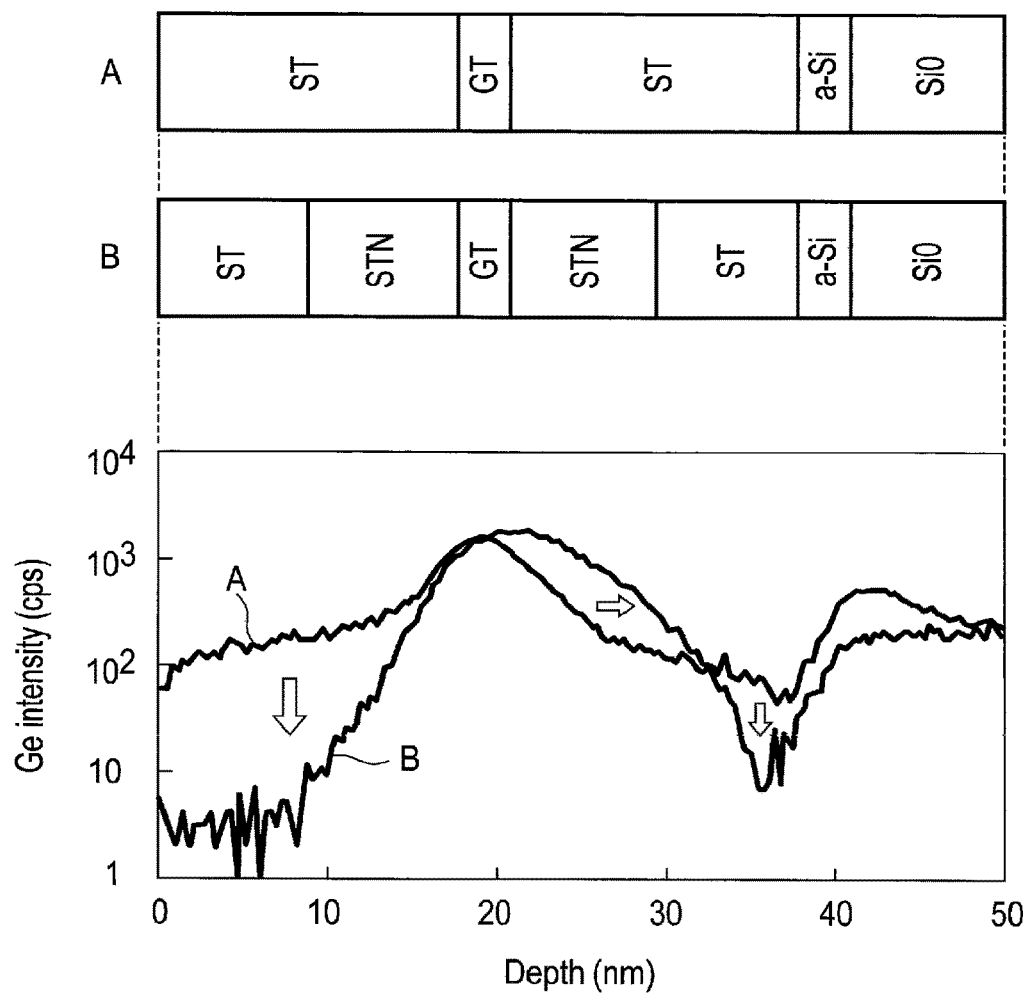
F I G. 12

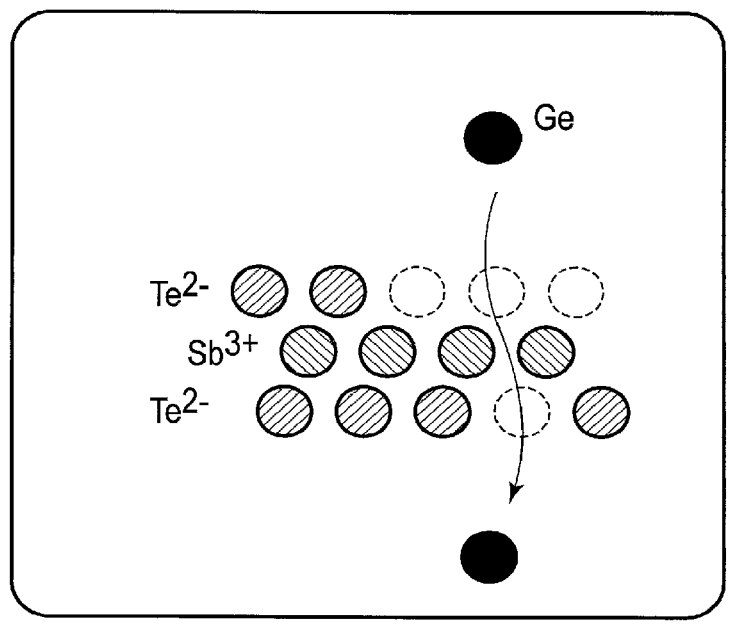
F I G. 13A
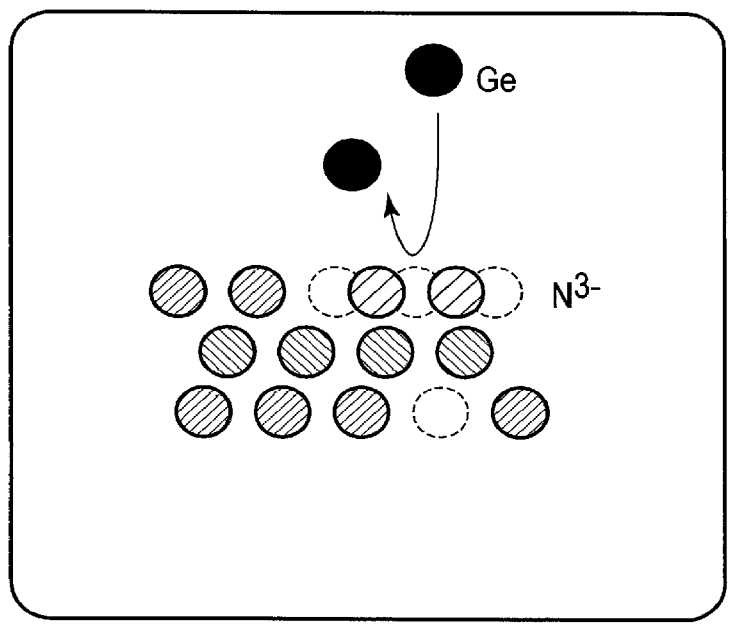
F I G. 13B

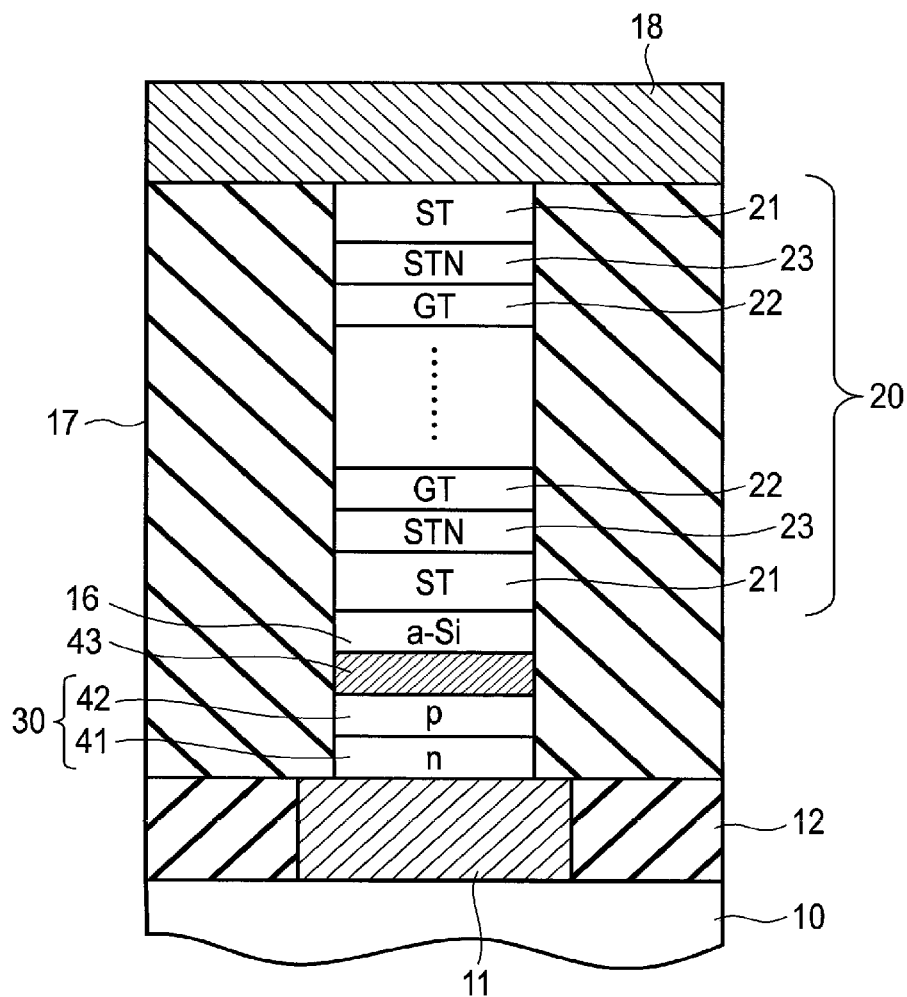
F I G. 14

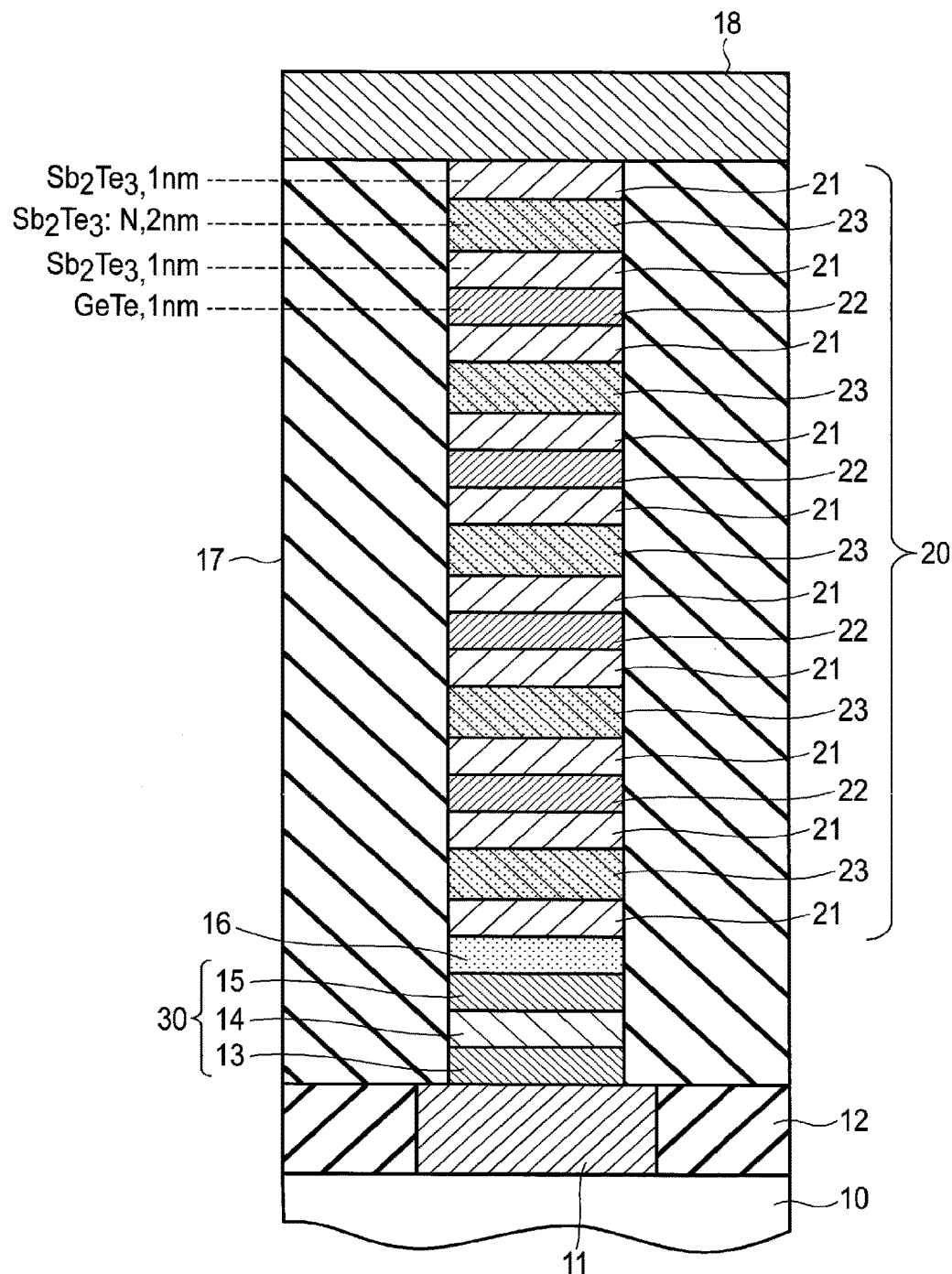
F I G. 17

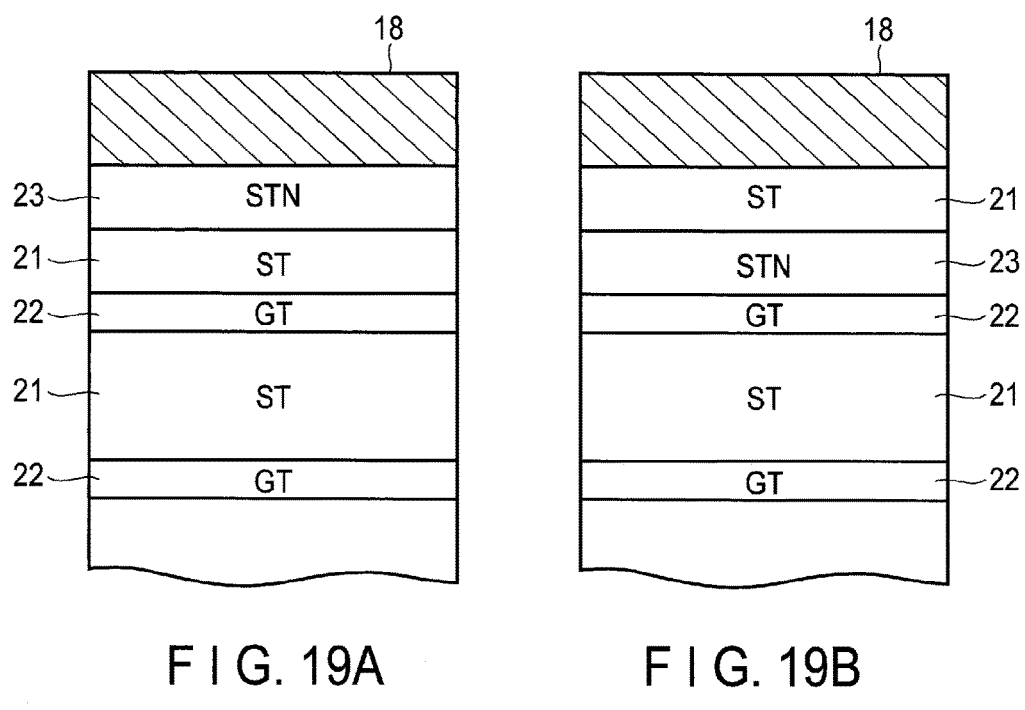
F I G. 19A   F I G. 19B

US 10,283,707 B2

SUPERLATTICE MEMORY HAVING GETE LAYER AND NITROGEN-DOPED SB₂TE₃ LAYER AND MEMORY DEVICE HAVING THE SAME

CROSS-REFERENCE TO RELATED APPLICATIONS

This application is based upon and claims the benefit of priority from Japanese Patent Application No. 2016-205908, filed Oct. 20, 2016, the entire contents of which are incorporated herein by reference.

FIELD

Embodiments described herein relate generally to a superlattice memory, and a cross-point type memory device using the superlattice memory.

BACKGROUND

In recent years, a superlattice memory in which a layered crystal (GeTe/$Sb_2Te_3$) formed by alternately stacking GeTe layers and $Sb_2Te_3$ layers between two electrodes is provided receives attention. In this superlattice memory, the resistance value thereof can be changed by the movement of Ge atoms in the layered crystal. For this reason, switching of a current lower than the case of the phase-change memory is enabled, and reduction in power consumption can be achieved.

However, in a cross-point type memory device using the superlattice memory, the limitation on the number of times of rewriting, i.e., setting (writing)/resetting (erasing) of data at each memory cell becomes a problem.

BRIEF DESCRIPTION OF THE DRAWINGS

FIG. 1 is a perspective view showing the schematic configuration of a cross-point type memory device according to a first embodiment.

FIG. 2 is an equivalent circuit diagram showing the circuit configuration of the cross-point type memory device according to the first embodiment.

FIGS. 4A and 4B, are schematic views showing the device structure of the superlattice memory of FIG. 3 and a reference example by comparison with each other.

FIG. 5 is a schematic diagram for explaining a setting/resetting operation in a super superlattice memory.

FIG. 6 is a characteristic graph showing the N concentration of the $Sb_2Te_3$:N layer in the depth direction.

FIG. 7 is a characteristic graph showing the flow ratio dependence of the N concentration in the $Sb_2Te_3$:N layer.

FIG. 8 is a characteristic graph showing the O concentration in the $Sb_2Te_3$:N layer in the depth direction.

FIG. 9 is a characteristic graph showing the Si concentration in the $Sb_2Te_3$:N layer in the depth direction.

FIG. 10 is a characteristic graph showing an X-ray diffraction pattern of a case where N is added to the $Sb_2Te_3$ layer.

FIG. 11 is a characteristic graph showing an X-ray diffraction pattern of a case of lamination of $Sb_2Te_3$/$Sb_2Te_3$:N.

FIG. 12 is a schematic view for explaining a difference in the diffusion state of Ge due to addition of N to the $Sb_2Te_3$ layer.

FIGS. 13A and 13B are schematic views for explaining a difference in the diffusion path of Ge due to addition of N to the $Sb_2Te_3$ layer.

FIG. 14 is a cross-sectional view showing a modification example of the first embodiment.

FIG. 17 is a cross-sectional view showing the device structure of a superlattice memory used in a cross-point type memory device according to a third embodiment.

FIGS. 19A and 19B are cross-sectional views showing modification examples of the fourth embodiment.

DETAILED DESCRIPTION

In general, according to one embodiment, a superlattice memory comprising: a substrate; a first electrode provided on the substrate; a second electrode arranged in opposition to the first electrode; and a superlattice structure part provided between the first electrode and the second electrode, which includes first chalcogen compound layers, second chalcogen compound layers the composition of which is different from the first chalcogen compound, and contains Ge, and third chalcogen compound layers in which one of N, B, C, O, and F is added to the first chalcogen compound, stacked one on another.

Hereinafter, cross-point type memory devices of the embodiments will be described with reference to the drawings.

(First Embodiment)

FIG. 1 and FIG. 2 are views for explaining the schematic configuration of a cross-point type memory device according to a first embodiment, and FIG. 1 is a perspective view and FIG. 2 is an equivalent circuit diagram.

On a substrate not shown, a plurality of word lines (second lines: WL [WL1, WL2, ... ]) functioning as lower electrodes (first electrodes) 11 are arranged in parallel with each other. A plurality of bit lines (first lines: BL [BL1, BL2, ... ]) functioning as upper electrodes (second electrodes) 18 are arranged in parallel with each other and perpendicular to the word lines WL. Further, a superlattice memory formed by connecting a superlattice memory cell 20 and a selector 30 in series with each other is provided at each of intersection parts at which the word lines WL and the bit lines BL intersect each other. That is, part of each of the word lines WL and part each of the bit lines BL are arranged in opposition to each other, and a superlattice memory is provided between a word line and a bit line at each of the opposition positions. It should be noted that in FIG. 1, an interlayer insulating film and the like are omitted in order to make the configuration easy to understand.

Figure 3:
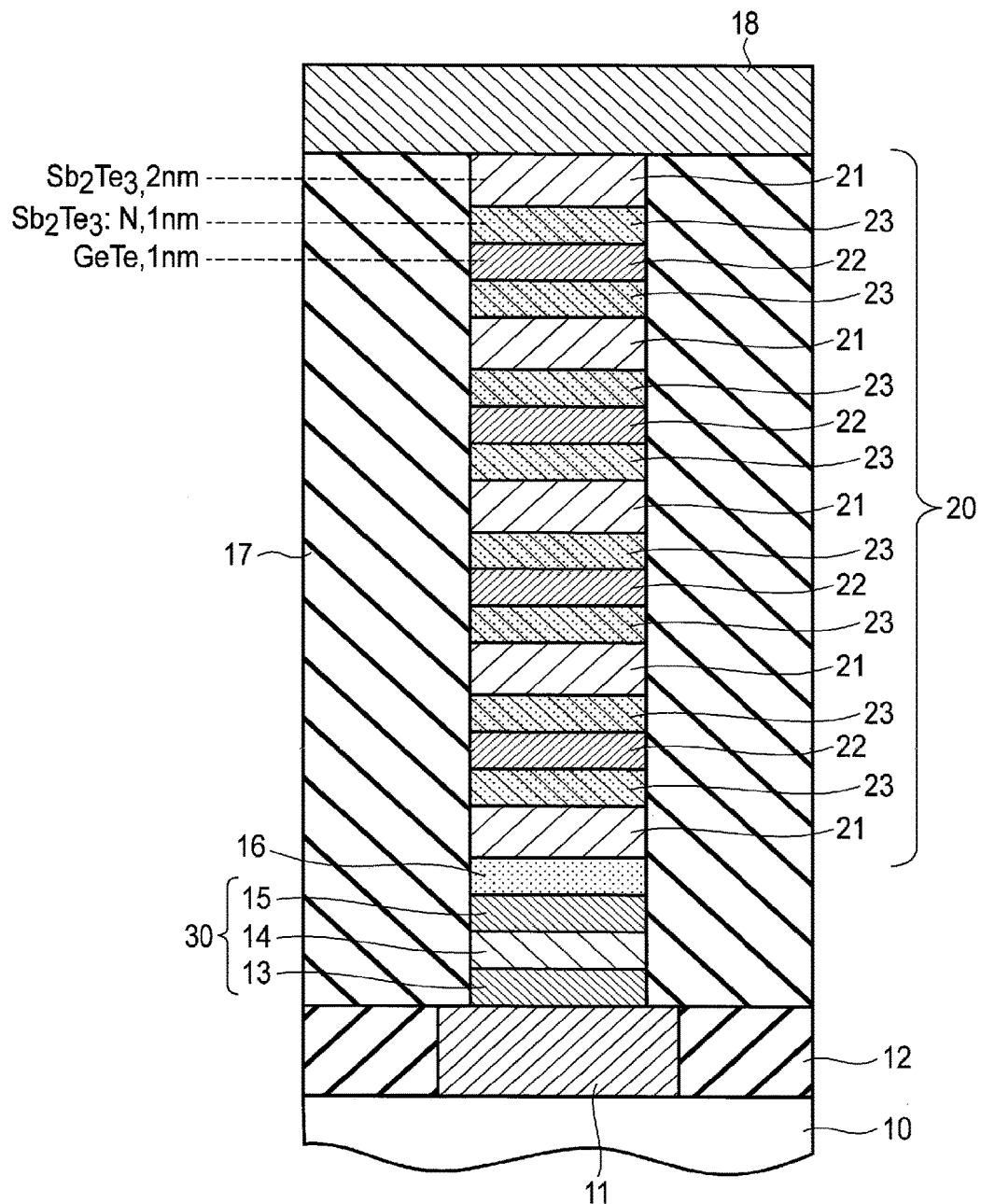
FIG. 3 is a cross-sectional view showing the device structure of a superlattice memory used in the cross-point type memory device of FIG. 1.

FIG. 3 is a cross-sectional view showing the device structure of the superlattice memory constituted of the superlattice memory cell 20 and the selector 30.

On a substrate 10, a lower electrode 11 is provided. This lower electrode 11 constitutes the word line WL of FIG. 1, and extends in a direction perpendicular to the page surface. The lateral parts of the lower electrode 11 are embedded in an insulating film 12 formed of $SiO_2$ or the like. It should be noted that the lower electrode 11 itself may not be made the word line WL, and the lower electrode 11 may be provided on the word line WL. Further, the substrate 10 is, for example, a semiconductor substrate, and this semiconductor substrate is provided with a CMOS circuit and the like for write and read of data to/from the memory.

On the lower electrode 11, the selector 30 and the resistance-change type superlattice memory cell 20 are provided in a pillared shape.

More specifically, a metallic layer 13, selector-material layer 14, and metallic layer 15 are formed on the lower electrode 11 by sputtering or by CVD, whereby the selector 30 is constituted. That is, an ovonic device in which the selector material layer 14 of TeGe or the like is interposed between the metallic layers 13 and 15 is constituted. This ovonic device functions as a switching device or a rectifying device.

It should be noted that the material for the selector material layer 14 is not limited to GeTe, and SiTe, ZnTe, AsTeGeSiN, and other Te compounds can be used. Furthermore, other chalcogen materials can also be used.

Further, as the selector 30, besides the ovonic device, a p-n junction device constituted of junction of a single element semiconductor of Si, Ge, and the like, oxide semiconductor of InGaZnO, $SnO_2$, and the like, or a semiconductor of SbTe/BiTe, and the like can also be used. Further, a pin diode device, metallic insulator device of $NbO_2$, $VO_2$ and the like, or tunnel barrier device of TaO/TiO/TaO and the like can also be used. Furthermore, a Cu-based rectifying device called MIEC, and the like can also be used. It should be noted that the element ratio of the above-mentioned composition is not limited to 1:1 or the like, and includes arbitrary element ratios.

On the metallic layer 15, an amorphous silicon layer (a-Si layer) 16 is provided, and a resistance-change type superlattice memory cell 20 is provided thereon. The a-Si layer 16 is formed into a thin layer of, for example, 1 nm, and is used as a seed layer of the superlattice structure part formed thereon. Further, the a-Si layer 16 is a layer contributing to improvement in the crystallizability of the superlattice structure part.

The superlattice memory cell 20 has a superlattice structure in which $Sb_2Te_3$ layers (first chalcogen compound layers) 21, GeTe layers (second chalcogen compound layers) 22, and $Sb_2Te_3$:N layers (third chalcogen compound layers) 23 formed by adding N to $Sb_2Te_3$ are stacked by sputtering, CVD, ALD, MBE or the like.

More specifically, an $Sb_2Te_3$ layer 21, $Sb_2Te_3$:N layer 23, GeTe layer 22, and $Sb_2Te_3$:N layer 23 are stacked in the order mentioned on the a-Si layer 16 and, furthermore these layers are repetitively stacked. Further, the superlattice structure is a structure in which the uppermost layer is made an $Sb_2Te_3$ layer 21.

Further, this structure can be explained as follows. In FIG. 4A, a conventional superlattice structure in which $Sb_2Te_3$ layers (ST) 21 and GeTe layers (GT) 22 are alternately stacked is shown as a reference example. In this embodiment, a structure in which in addition to the above configuration, as shown in FIG. 4B, an $Sb_2Te_3$:N layer (STN) 23 is interposed between the $Sb_2Te_3$ layer (ST) 21 and the GeTe layer (GT) 22 is employed.

Regarding the thickness of each of the layers 21, 22, and 23, the thickness of, for example, the $Sb_2Te_3$ layer 21 is made 2 nm, that of the GeTe layer 22 is made 1 nm, and that of the $Sb_2Te_3$:N layer 23 is made 1 nm. Further, the number of lamination of the $Sb_2Te_3$ layer 21, GeTe layer 22, and $Sb_2Te_3$:N layer 23 for constituting the superlattice memory 20 can appropriately be changed according to the specification.

It should be noted that the $Sb_2Te_3$ layer 21 and the GeTe layer 22 are formed by, for example, sputtering using Ar gas. That is, the $Sb_2Te_3$ layer 21 is formed by sputtering an $Sb_2Te_3$ target in Ar gas, and the GeTe layer 22 is formed by sputtering a GeTe target in Ar gas.

Further, the $Sb_2Te_3$:N layer 23 is formed by sputtering using a mixed gas obtained by adding N to Ar. That is, the $Sb_2Te_3$:N layer 23 is formed by carrying out sputtering in a mixed gas of Ar and N using an $Sb_2Te_3$ target without the need for a new target to form the $Sb_2Te_3$:N layer 23.

Further, the layers 13 to 16, and 21 to 23 are processed into a pillared shape by subjecting them to selective etching by RIE or the like.

Here, the superlattice memory makes the fact that positions of Ge atoms are interchanged in the crystal structure by a voltage or a current to be applied thereto the principle of operation thereof. Further, as compared with a phase-change memory using a phase-change material such as $Ge_2Sb_2Te_5$ or the like, the superlattice memory enables switching at a low current, and is effective for reduction in power consumption.

As shown in FIG. 5, the superlattice memory cell can take a set state or a reset state by the movement of Ge atoms. More specifically, by the electrical energy to be input to the memory cell, Ge atoms existing in the GeTe layer are diffused into an interface between the GeTe layer concerned and the $Sb_2Te_3$ layer. Thereby, a structure identical to the crystalline state can be formed as a "crystal having anisotropy" (set state). The electrical resistance of the above structure becomes lower than the structure before the Ge atoms are diffused.

Further, the Ge atoms accumulated in the interface are returned to the inside of the original GeTe layer by the electrical energy input to the memory cell. Thereby, it is possible to restore the structure to the "amorphous-state-like structure" having an electrical resistance value equivalent to the random structure formerly called the amorphous structure (reset state). In this case, the electrical resistance becomes higher.

As described above, by interchanging positions of Ge atoms in the crystalline structure and thereby changing the resistance value, the memory is made to function as a resistance-change type memory.

An upper electrode (second electrode) 18 is provided on the superlattice memory cell 20. The upper electrode 18 constitutes the bit line BL in FIG. 1, and extends in a lateral direction of the page surface in FIG. 3. Here, the upper electrode 18 itself may not be made the bit line BL, and the bit line BL may be provided on the upper electrode 18.

It should be noted that an interlayer insulating film 17 constituted of $SiO_2$ or the like is provided in such a manner that the spaces among the pillars of the selector 30, a-Si layer 16, and superlattice memory cell 20 are filled with the film 17, and the top surface of the interlayer insulating film is planarized. Further, the upper electrode 18 is provided to extend along the top surface of the interlayer insulating film 17 so that top surfaces of a plurality of superlattice memory cells 20 can be connected to each other.

As described above, in this embodiment, a superlattice memory constituted of a series circuit of a superlattice memory cell 20 and a selector 30 is connected to each of the intersection parts of the bit lines BL and the word lines WL, whereby a cross-point type memory device can be manufactured.

Further, in this embodiment, the structure in which an Sb$_2$Te$_3$:N layer 23 is interposed between each of the Sb$_2$Te$_3$ layers 21 and each of the GeTe layer 22 as opposed to the general superlattice structure as shown in FIG. 4A is employed. By this addition of the Sb$_2$Te$_3$:N layer 23, it is possible to prevent Ge from diffusing into the Sb$_2$Te$_3$ layer 21. Thereby, it becomes possible to prevent Ge atoms from gathering together on the negative electrode side, and increase the number of times of rewriting.

Further, the superlattice structure is not directly formed on the metallic layer 15, the a-Si layer 16 is formed on the metallic layer 15, and the superlattice structure is formed on the a-Si layer 16, whereby an advantage of enabling improvement in the crystallizability of the superlattice structure is obtained. Furthermore, there is also an advantage that the manufacturing cost can be prevented from increasing concomitantly with the addition of the Sb$_2$Te$_3$:N layer 23 without the need for a new target to form the Sb$_2$Te$_3$:N layer 23.

Next, the function and advantage obtained by this embodiment will be described in more detail with reference to FIG. 6 through FIGS. 13A and 13B.

In the case of the superlattice structure shown in FIG. 4A provided with no Sb$_2$Te$_3$:N layer 23, Ge atoms in the GeTe layer 22 easily diffuse into the Sb$_2$Te$_3$ layer 21. When the Ge atoms have diffused into the Sb$_2$Te$_3$ layer 21, if the set/rest operation is repeated, the Ge atoms gather together in the vicinity of the interface between the superlattice part and the negative electrode. Further, by the gathering of the Ge atoms, the number of times of rewriting is limited to about $10^8$.

Conversely, in this embodiment, as shown in FIG. 4B, by providing the Sb$_2$Te$_3$:N layer 23 between the Sb2Te3 layer 21 and the GeTe layer 22, Ge atoms can be prevented from diffusing into the Sb$_2$Te$_3$ layer 21. Accordingly, it is possible to prevent Ge atoms from gathering together in the vicinity of the interface between the superlattice structure part and the negative electrode. Thereby, it is possible to largely increase the number of times of rewriting which has been about $10^8$ times in the conventional structure.

It should be noted that prevention of the diffusion of Ge atoms described above does not mean that the Ge atoms are perfectly prevented from diffusing into the Sb$_2$Te$_3$ layer 21, but means that the Ge atoms are prevented from diffusing into the Sb$_2$Te$_3$ layer 21 to such a degree that diffusion of the Ge atoms owing to voltage application between the electrodes 11 and 18 can be allowed.

FIG. 6 shows a result of measuring the N concentration of the Sb$_2$Te$_3$:N layer formed by sputtering by using SIMS, and is a characteristic graph showing the N concentration in the depth direction. The axis of abscissa indicates the length in the depth direction (nm), and the axis of ordinate indicates the N intensity (secondary ion intensity (cps)).

It should be noted that each of the following measurement examples has also been carried out by SIMS. Furthermore, although each of the cases where the flow ratios [N/(Ar+N) %] of N in the mixed gas used in sputtering are 0%, 1%, 5%, and 10% has been measured, the result of the case of 0% has been almost identical to the case of 1%, and hence the results of these cases are omitted.

FIG. 7 is a characteristic graph showing the flow ratio dependence of the N concentration in the film. The axis of abscissa indicates the flow ratio [N/(Ar+N) %] of N in the mixed gas used in sputtering, and the axis of ordinate indicates the N concentration (at %).

The Sb$_2$Te$_3$:N layer was formed by sputtering in the sputtering gas (mixed gas of Ar and N) using Sb$_2$Te$_3$ as a target. The higher the flow ratio of N in the sputtering gas, the higher the N concentration in the Sb2Te3:N layer is, and when the flow ratio of N becomes 5% or higher, the N concentration in the Sb$_2$Te$_3$:N layer becomes 6 at % which is a sufficiently high value. When the flow ratio of N was 1% or lower, the N concentration in the Sb$_2$Te$_3$:N layer was an extremely low value which was almost identical to the case of 0%.

FIG. 8 is a characteristic graph showing the oxygen (O) concentration in the Sb$_2$Te$_3$:N layer in the depth direction. The axis of abscissa indicates the depth from the surface of the Sb$_2$Te$_3$:N layer, and the axis of ordinate indicates the O intensity (secondary ion intensity (cps)). As the additive amount of N becomes larger, the diffusion of O from the surface is restrained more strongly. Further, when the flow ratio of N is 5% or higher, it can be seen that O is sufficiently prevented from diffusing into the Sb$_2$Te$_3$:N layer.

FIG. 9 is a characteristic graph showing the silicon (Si) concentration in the Sb$_2$Te$_3$:N layer in the depth direction. The axis of abscissa indicates the depth from the surface of the substrate, and the axis of ordinate indicates the intensity (secondary ion intensity (cps)) of Si. As the additive amount of N becomes larger, the diffusion of Si from the substrate side is restrained more strongly. Further, when the flow ratio of N is 5% or higher, it can be seen that Si is sufficiently prevented from diffusing from the substrate side into the Sb$_2$Te$_3$:N layer.

As described above, it can be seen that various types of elements are prevented from diffusing into the Sb$_2$Te$_3$:N layer 23 to which N is added to a higher degree than the Sb2Te3 layer 21.

FIG. 10 is a graph showing an XRD (X-ray diffraction) result of a case where N is added to the Sb$_2$Te$_3$ layer. The axis of abscissa indicates the diffraction angle 2θ, and the axis of ordinate indicates the diffraction intensity. The reference symbol A in FIG. 10 indicates a diffraction pattern of the Sb$_2$Te$_3$ layer to which N is not added, B indicates a diffraction pattern of the Sb$_2$Te$_3$:N layer [N/(N+Ar)=5%] to which N is added, and C indicates a diffraction pattern of the Sb$_2$Te$_3$:N layer [N/(N+Ar)=10%] to which N is added.

As compared with the case (A) where there is no addition of N, in each of the cases (B, C) where there is addition of N, the peak value of the diffraction intensity is lower, and the half-value width is greater. Further, as a result of investigation using X-TEM (cross-sectional image obtained by transmission electron microscope), it has been seen that in the case where there is addition of N, the crystalline grain becomes smaller, and the C-axis orientation of the seed layer is deteriorated. That is, it is conceivable that when the Sb$_2$Te$_3$ layer is simply replaced with the Sb$_2$Te$_3$:N layer, the crystallizability lowers.

FIG. 11 is a graph showing an XRD result of a case of lamination of Sb$_2$Te$_3$/Sb$_2$Te$_3$:N. The reference symbol A in FIG. 11 indicates the case where the Sb$_2$Te$_3$:N layer is not provided as shown in FIG. 4A. Further, B indicates the case where the Sb$_2$Te$_3$:N layer is provided as shown in FIG. 4B. In either case, the diffraction pattern exhibits excellent characteristics. Further, as a result of investigation using X-TEM, it has been seen that in the case where there is the interposition of the Sb$_2$Te$_3$:N layer, the crystallizability is further improved, and the C-axis orientation has no problem.

That is, it is conceivable that not by replacing the whole of the Sb$_2$Te$_3$ layer with the Sb$_2$Te$_3$:N layer, but by replacing part of the Sb$_2$Te$_3$ layer with the Sb$_2$Te$_3$:N layer, the crystallizability can be prevented from lowering. Accordingly, the configuration in which the Sb$_2$Te$_3$:N layer 23 is interposed between the Sb$_2$Te$_3$ layer 21 and the GeTe layer 22 as described in this embodiment makes it possible to manufacture the superlattice structure with excellent crystallizability.

FIG. 12 is a schematic view for explaining a difference in the diffusion state of Ge due to addition of N to the $Sb_2Te_3$ layer. The axis of abscissa indicates the depth (the left is the surface side, and the right is the substrate side) from the surface, and the axis of ordinate indicates the intensity of Ge (secondary ion intensity (cps)). The reference symbol A in FIG. 12 indicates the case of a reference example as shown in FIGS. 4A, and B indicates the case where the $Sb_2Te_3$:N layer is interposed as shown in FIG. 4B.

It can be seen that by the interposition of the $Sb_2Te_3$:N layer, the concentration of Ge on the surface side becomes lower, and diffusion of Ge is prevented. It should be noted that although on the substrate side, the concentration of Ge is increased in the $Sb_2Te_3$:N layer in the vicinity of the GeTe layer, it is conceivable that this is because Ge has diffused due to Ge—N combination. However, it can be seen that on the substrate side too, the concentration of Ge becomes lower in the $Sb_2Te_3$ layer, and diffusion of Ge is prevented.

Accordingly, even when the negative electrode is arranged on either of the substrate side and the surface side, it becomes possible to prevent Ge atoms from gathering together in the vicinity of the electrode.

Here, the advantageous effect of preventing diffusion of Ge in the superlattice structure is explained as follows. In the $Sb_2Te_3$ layer, as shown in FIG. 13A, regarding the Sb/Te ratio, there is small lack of Te, and Te holes appear. For this reason, diffusion of Ge is facilitated.

Conversely, in the $Sb_2Te_3$:N layer, N combines with Sb, but does not combine with Te, and hence as shown in FIG. 13B, N enters the Te site to thereby compensate for the Te holes and fill the diffusion path therewith. That is, three Te holes are complemented with two N atoms. Thereby, it becomes possible to prevent Ge from diffusing.

It should be noted that such a compensation effect can be expected not only of N, but also of F ($F^-$) and O ($O^{2-}$). Furthermore, such a compensation effect can also be expected of B and C which are light elements having a period identical to N.

Further, in this embodiment, although an ovonic device is used as the selector 30, in place of the ovonic device, as shown in FIG. 14, a diode based on p-n junction of Si can also be used. That is, a configuration in which an n-type Si layer 41 and a p-type Si layer 42 are formed on a lower electrode 11, and a metallic layer 43 is provided on the layer 42 may also be employed. That the diode may be used as the selector 30 in place of the ovonic device is also true of the following embodiments.

(Second Embodiment)

Figure 15:
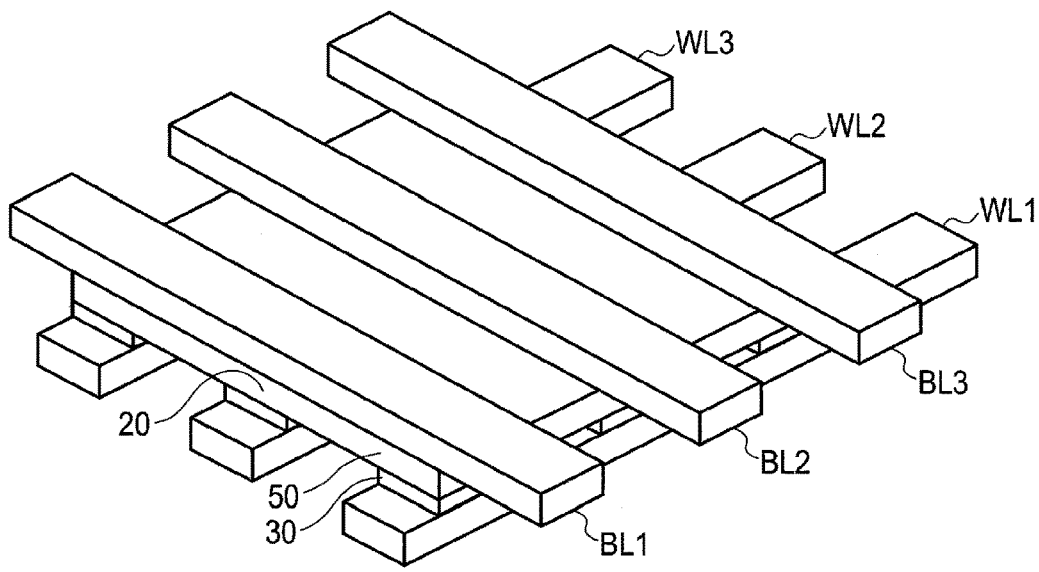
FIG. 15 is a perspective view showing the schematic configuration of a cross-point type memory device according to a second embodiment.
Figure 16:
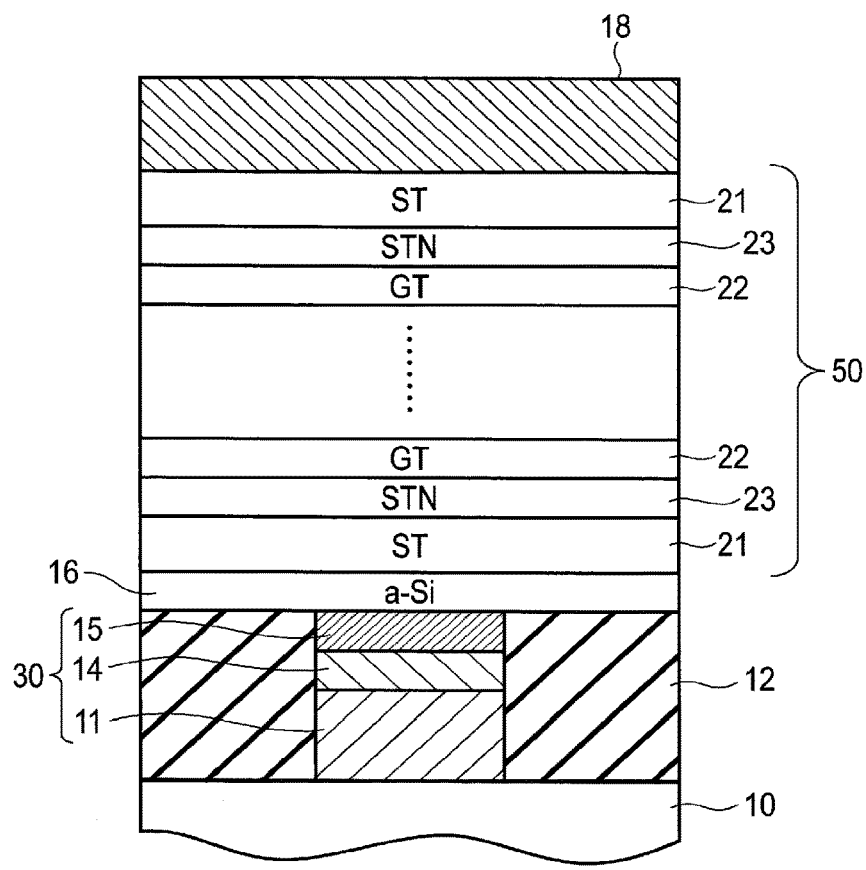
FIG. 16 is a cross-sectional view showing the device structure of a superlattice memory used in the cross-point type memory device of FIG. 15.

FIGS. 15 and 16 are views for explaining a cross-point type memory device according to a second embodiment. FIG. 15 is a perspective view showing the schematic configuration of the cross-point type memory device, and FIG. 16 is a cross-sectional view showing the device structure of a superlattice memory. It should be noted that parts identical to those in FIGS. 1 and 3 are denoted by reference symbols identical to FIGS. 1 and 3, and their detailed descriptions are omitted.

What makes this embodiment different from the aforementioned first embodiment is that the layers 21, 22, and 23 constituting the superlattice memory cell 20 are not processed into a pillared shape, and are made consecutive over a plurality of cells. That is, the laminated configuration of a superlattice structure part 50 of $Sb_2Te_3$ layers (first chalcogen compound layers) 21, GeTe layers (second chalcogen compound layers) 22, and $Sb_2Te_3$:N layers (third chalcogen compound layers) 23 is identical to the first embodiment. However, this superlattice structure part 50 is formed only by accumulation using sputtering or the like, and is not subjected to an etching process by RIE or the like.

In such a configuration, in the superlattice structure part 50, intersection parts of bit lines BL and word lines WL function as substantial superlattice memory cells 20. That is, although the superlattice structure part 50 is made consecutive by adjacent cells, as long as the distance between adjacent cells is not extremely short, cell separation is enabled, and the equivalent circuit of the memory cells 20 becomes identical to that shown in FIG. 2.

Accordingly, in this embodiment too, a cross-point type memory device can be manufactured as in the case of the aforementioned first embodiment, and an advantage identical to the first embodiment can be obtained. Further, in this embodiment, the etching process of the superlattice structure part 50 is made unnecessary, and hence there is also an advantage that the manufacturing process is simplified.

(Third Embodiment)

FIG. 17 is a cross-sectional view showing the device structure of a superlattice memory used in a cross-point type memory device according to a third embodiment. It should be noticed that parts identical to those in FIG. 3 are denoted by reference symbols identical to FIG. 3, and their detailed descriptions are omitted.

What makes this embodiment different from the aforementioned first embodiment is that the $Sb_2Te_3$:N layer (third chalcogen compound layer) 23 is not interposed between the $Sb_2Te_3$ layer (first chalcogen compound layer) 21 and the GeTe layer (second chalcogen compound layer) 22, and is interposed between $Sb_2Te_3$ layers 21. That is, an $Sb_2Te_3$ layer 21, $Sb_2Te_3$:N layer 23, $Sb_2Te_3$ layer 21, and GeTe layer 22 are formed on an a-Si layer 16, and furthermore, these layers are repetitively stacked in sequence. Further, a structure in which the uppermost layer is made the $Sb_2Te_3$ layer 21 is formed.

This structure is equivalent to the superlattice structure shown in FIG. 4A formed by alternately stacked the $Sb_2Te_3$ layers 21 and the GeTe layers 22, in which each of the $Sb_2Te_3$ layer 21 is divided into two equal parts at a central position in the depth direction, and an $Sb_2Te_3$:N layer 23 is interposed between the divided parts of each $Sb_2Te_3$ layer 21. Further, it can also be said that the structure of this embodiment is a structure in which the GeTe layers 22 and the $Sb_2Te_3$:N layers 23 are alternately stacked, and the $Sb_2Te_3$ layer 21 is interposed between each of the GeTe layers 22 and each of the $Sb_2Te_3$:N layers 23.

Regarding the thickness of each of the layers 21, 22, and 23 in this embodiment, for example, the thickness of the $Sb_2Te_3$ layer 21 is made 1 nm, the GeTe layer 22 is made 1 nm, and the $Sb_2Te_3$:N layer 23 is made 2 nm.

Even with such a configuration, Ge can be prevented from diffusing into the $Sb_2Te_3$ layer 21 as in the case of the first embodiment. That is, when two $Sb_2Te_3$ layers 21 between which one $Sb_2Te_3$:N layer 23 is interposed are regarded as one layer, Ge can be prevented from diffusing into the $Sb_2Te_3$ layer 21. Accordingly, it is possible to prevent Ge atoms from gathering together on the electrode side, and increase the number of times of rewriting.

Further, in this embodiment, the $Sb_2Te_3$:N layer 23 does not come into direct contact with the GeTe layer 22, and hence N can be prevented from diffusing into the GeTe layer 22. Thereby, it becomes possible to prevent Ge diffusion due to Ge—N combination.

(Fourth Embodiment)

Figure 18:
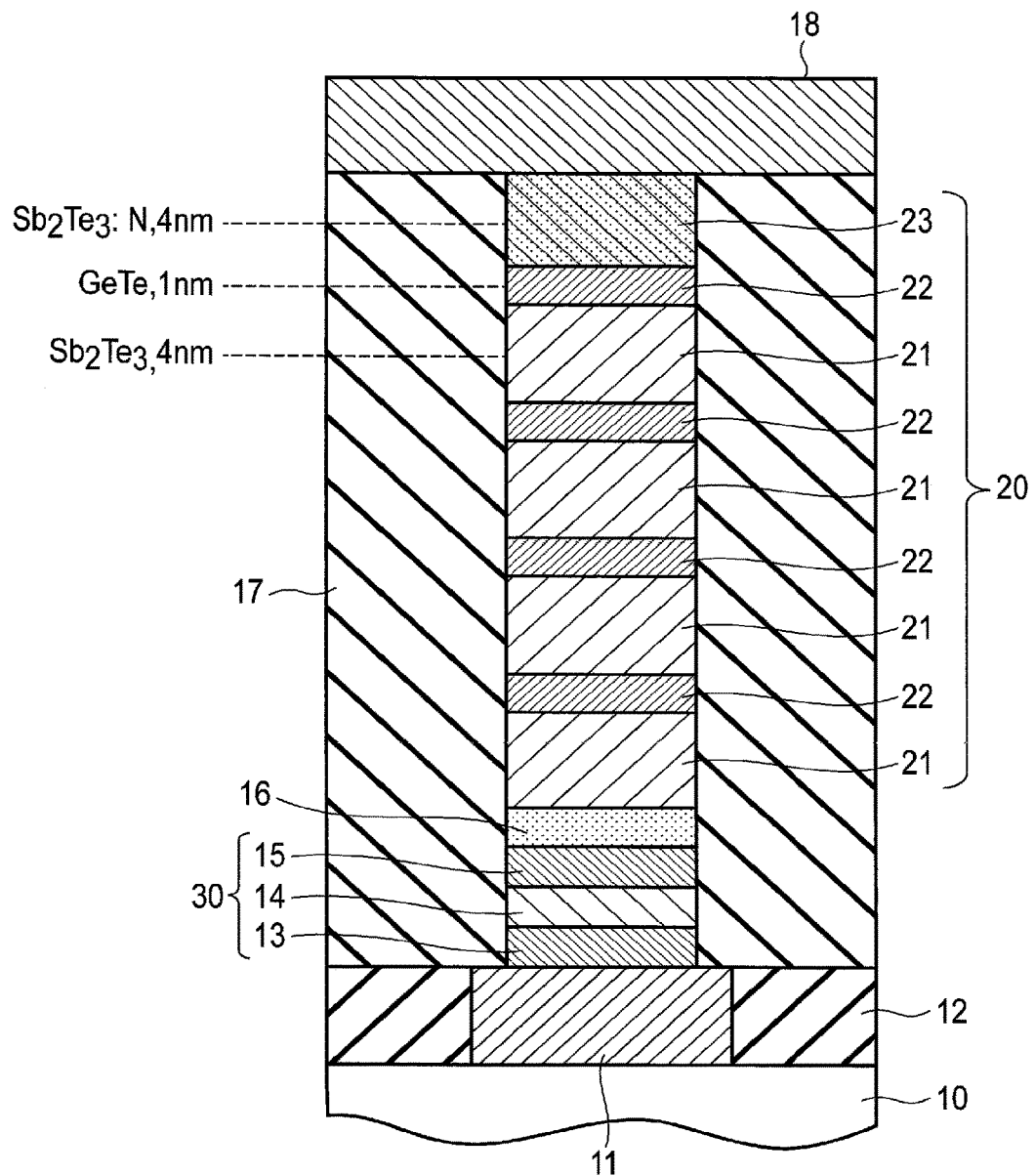
FIG. 18 is a cross-sectional view showing the device structure of a superlattice memory used in a cross-point type memory device according to a fourth embodiment.

FIG. 18 is a cross-sectional view showing the device structure of a superlattice memory used in a cross-point type memory device according to a fourth embodiment. It should be noted that parts identical to those in FIG. 3 are denoted by reference symbols identical to FIG. 3, and their detailed descriptions are omitted.

What makes this embodiment different from the aforementioned first embodiment is that the $Sb_2Te_3$:N layer (third chalcogen compound layer) 23 is not interposed between the $Sb_2Te_3$ layer (first chalcogen compound layer) 21 and the GeTe layer (second chalcogen compound layer) 22, and is interposed between the uppermost GeTe layer 22 and the upper electrode 18. That is, $Sb_2Te_3$ layers 21 and GeTe layers 22 are alternately stacked on an a-Si layer, and an $Sb_2Te_3$:N layer 23 is provided on the uppermost GeTe layer 22. It should be noted that the thickness of the $Sb_2Te_3$ layer 21 is made 4 nm, the GeTe layer 22 is made 1 nm, and the $Sb_2Te_3$:N layer 23 is made 4 nm.

With such a configuration, although diffusion of Ge cannot be prevented in the whole of the superlattice structure part, the $Sb_2Te_3$:N layer 23 is provided between the uppermost GeTe layer 22 and the upper electrode 18, and hence diffusion of Ge into the upper electrode 18 side can be prevented. Accordingly, when the upper electrode 18 is used as a negative electrode, Ge atoms can be prevented from gathering together in the vicinity of the upper electrode 18, whereby it becomes possible to increase the number of times of rewriting.

It should be noted that in place of the uppermost $Sb_2Te_3$:N layer 23, two layers formed by arranging an $Sb_2Te_3$:N layer 23 on an $Sb_2Te_3$ layer 21 may be provided as shown in FIG. 19A. Furthermore, conversely, two layers formed by arranging an $Sb_2Te_3$ layer 21 on an $Sb_2Te_3$:N layer 23 may be provided as shown in FIG. 19B.

Even with such a configuration, Ge atoms can be prevented from gathering together in the vicinity of the upper electrode 18, whereby it becomes possible to increase the number of times of rewriting.

(Modification Example)

It should be noted that the present invention is not limited to the embodiments described above.

The first chalcogen compound layer is not necessarily limited to $Sb_2Te_3$, and it is sufficient if the compound is a chalcogen compound containing Sb. Furthermore, it is also possible to use a compound single crystal or multicrystal of the homologous series $[(AC)_m(B_2D_3)]_n$, here, A and B are elements, C and D are Te, Se, S or O element, and m and n are numerals] such as $(Sb_2Te_3)_n$ in which at least part of Sb is replaced with Bi, As, P or N, or at least part of Te is replaced with Se, S or O, and the like.

Further, the second chalcogen compound layer is not necessarily limited to GeTe, and it is sufficient if the compound is a chalcogen compound containing Ge. Furthermore, in place of N to be added to the first chalcogen compound, B, C, O or F can also be used.

In the embodiments, although the a-Si layer has been provided in order to improve the crystallizability of the superlattice structure part, when the superlattice structure part can be formed with sufficient crystallizability even without the a-Si layer, the a-Si layer can be omitted. Furthermore, the superlattice memory is not necessarily limited to the two-dimensionally arranged structure. It is also possible to apply the superlattice memory to a three-dimensionally arranged three-dimensional memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A superlattice memory comprising:
   a substrate;
   a first electrode provided on the substrate;
   a second electrode arranged in opposition to the first electrode;
   a superlattice structure part provided between the first electrode and the second electrode, the superlattice structure part including first chalcogen compound layers of a first chalcogen compound, second chalcogen compound layers of a second chalcogen compound the composition of which is different from the first chalcogen compound, and a third chalcogen compound layer of a third chalcogen compound in which N is added to the first chalcogen compound, stacked one on another, and
   an amorphous Si seed layer between the first electrode and the superlattice structure part, wherein
   each of the first chalcogen compound layers is an $Sb_2Te_3$ layer, each of the second chalcogen compound layers is a GeTe layer, and the third chalcogen compound layer is an $Sb_2Te_3$:N layer.

2. The superlattice memory of claim 1, wherein the first chalcogen compound layers and the second chalcogen compound layers are alternately stacked, and the third chalcogen compound layer is provided between each of the first chalcogen compound layers and each of the second chalcogen compound layers.

3. The superlattice memory of claim 1, wherein the first chalcogen compound layers and the second chalcogen compound layers are alternately stacked, and the third chalcogen compound layer is interposed to the central part in the thickness direction of each of the first chalcogen compound layers.

4. The superlattice memory of claim 1, wherein the first chalcogen compound layers and the second chalcogen compound layers are alternately stacked, the uppermost layer is the second chalcogen compound layer, and the third chalcogen compound layer is provided between the second chalcogen compound layer of the uppermost layer and the second electrode.

5. The superlattice memory of claim 1, wherein the first chalcogen compound layers and the second chalcogen compound layers are alternately stacked, the uppermost layer of the superlattice structure part is the first chalcogen compound layer, and the third chalcogen compound layer is provided between the first chalcogen compound layer of the uppermost layer and the second electrode.

6. The superlattice memory of claim 1, wherein the first chalcogen compound layers and the second chalcogen compound layers are alternately stacked, the uppermost layer of the superlattice structure part is the first chalcogen compound layer, and the third chalcogen compound layer is provided between the first chalcogen compound layer of the uppermost layer and the second chalcogen compound layer adjacent to the uppermost first chalcogen compound layer.

7. The superlattice memory of claim 1, wherein the superlattice structure part is provided in a pillared shape.

8. The superlattice memory of claim 1, further comprising a selector device between the first electrode and the superlattice structure part.

9. The superlattice memory of claim 8, wherein the selector device is an ovonic device or a diode device.

10. A memory device comprising:
a plurality of first lines arranged in parallel with each other;
a plurality of second lines arranged in parallel with each other in such a manner that the second lines intersect the first lines;
superlattice memory cells arranged at intersection parts at which the first lines and the second lines intersect each other, the superlattice memory cells including first chalcogen compound layers of a first chalcogen compound, second chalcogen compound layers of a second chalcogen compound the composition of which is different from the first chalcogen compound, and a third chalcogen compound layer of a third chalcogen compound in which N is added to the first chalcogen compound, stacked one on another;
selector elements provided between the first lines or the second lines and the superlattice memory cells; and
an amorphous Si seed layer between the lowermost layer of the superlattice memory cell and the first lines or the second lines, wherein
each of the first chalcogen compound layers is an $Sb_2Te_3$ layer, each of the second chalcogen compound layers is a GeTe layer, and the third chalcogen compound layer is an $Sb_2Te_3$:N layer.

11. The memory device of claim 10, wherein the first chalcogen compound layers and the second chalcogen compound layers are alternately stacked, and the third chalcogen compound layer is provided between each of the first chalcogen compound layers and each of the second chalcogen compound layers.

12. The memory device of claim 10, wherein the first chalcogen compound layers and the second chalcogen compound layers are alternately stacked, and the third chalcogen compound layer is interposed to the central part in the thickness direction of each of the first chalcogen compound layers.

13. The memory device of claim 10, wherein the first chalcogen compound layers and the second chalcogen compound layers are alternately stacked, the uppermost layer is the second chalcogen compound layer, and the third chalcogen compound layer is provided between the second chalcogen compound layer of the uppermost layer and the second electrode.

14. The memory device of claim 10, wherein each of the selector elements is an ovonic element or a diode element.

15. The memory device of claim 10, wherein the first chalcogen compound layers, the second chalcogen compound layers, and the third chalcogen compound layer are provided in a pillared shape.

16. The memory device of claim 10, wherein the first chalcogen compound layers, the second chalcogen compound layers, and the third chalcogen compound layer are provided to be consecutive over a plurality of superlattice memory cells.

* * * * *